United States Patent [19]
Black

[11] 4,083,301
[45] Apr. 11, 1978

[54] STENCIL EXPOSURE SEAL COMBINATION

[76] Inventor: James A. Black, 13700 Sparta Ave., Kent City, Mich. 49330

[21] Appl. No.: 733,951

[22] Filed: Oct. 19, 1976

[51] Int. Cl.² .................................................. G03F 9/00
[52] U.S. Cl. .................................. 101/128.3; 355/91; 355/93
[58] Field of Search .................. 101/128.3, 128.4; 355/91, 93, 94, 87

[56] References Cited
U.S. PATENT DOCUMENTS

| 654,421 | 7/1900 | Soltman | 355/91 |
| 3,007,390 | 11/1961 | Forester et al. | 355/94 X |
| 3,463,587 | 8/1969 | Oltra et al. | 355/93 |
| 3,506,348 | 4/1970 | Brodie | 355/94 X |

Primary Examiner—Ronald E. Suter
Attorney, Agent, or Firm—Price, Heneveld, Huizenga & Cooper

[57] ABSTRACT

Stencil exposure apparatus having a flexible compressible peripheral seal element suspended by a plurality of radiating tension straps in a selected configuration between a translucent stencil pattern support surface on one side, and a stencil fabric layer retained in a stencil frame or chase on the other side, there being a suction connection for the space enclosed by said seal, said translucent surface, and said stencil fabric.

In one apparatus embodiment disclosed, the peripheral seal is a traveling seal suspended on a stencil frame carriage which is selectively shiftable relative to the translucent surface and supports the stencil chase.

In another apparatus embodiment disclosed, the tension straps are shiftable to vary the dimensions of the area enclosed by the peripheral seal.

8 Claims, 8 Drawing Figures

STENCIL EXPOSURE SEAL COMBINATION

BACKGROUND OF THE INVENTION

This invention relates to screen stencil exposure apparatus.

Making stencils for stencil screen printing typically involves the steps of coating a screen with a photo responsive emulsion, drying the coating, overlaying the coated fabric on a stencil pattern positive, exposing pattern areas of the emulsion coating to light through the stencil pattern positive, and subsequently developing the exposed emulsion to cause openings in the screen in the pattern desired. Using this prepared screen, stencilling fluid can be forced through the openings as with a squeegee in a conventional manner to selectively coat the underlying stock.

Apparatus for making these stencils normally includes a translucent, and preferably transparent, surface as of glass, on which the positive is mounted and against which a chase mounting the emulsion coated screen is placed. The periphery of the area to be exposed is sealed, and suction is used to draw the positive and the screen together for accurate exposure.

To form this peripheral seal, there is one technique wherein a rubber tube is recessed into a peripheral groove specially routed into the support platform around the translucent surface. Unfortunately, this limits the stencil area to basically one size. Thus, each different size stencil involves a different exposure apparatus.

Another technique involves manually placing a peripheral rubber tube around the stencil area and then squeezing the stencil screen frame to the transparent surface. This has obvious limitations including the necessity of carefully positioning the tube each time, the lack of positive dimensional control of the seal, and the necessity of using a generally horizontal work surface so the tube will stay in place.

The technique employed on vertical exposure units is usually that of placing a rubber blanket over the apparatus and drawing a vacuum. This is cumbersome and not very versatile.

SUMMARY OF THE INVENTION

An object of this invention is to provide stencil exposure apparatus employing a unique suspension seal arrangement that enables one apparatus to suffice for several different conditions. A resilient peripheral seal is specially suspended between the translucent support surface for the stencil positive on one side and the coated stencil screen retained on a stencil chase on the other side. The seal is suspended by a plurality of tension elements radiating outwardly of the seal member, in such a manner as to overlie the coated screen but without being mounted to the chase.

The suspended seal can selectively overlie various portions of the apparatus, even the glass or other translucent support surface. It is not limited to a single position and one set of dimensions.

One inventive form of the apparatus effects a traveling seal with this suspended arrangement, the seal being movable with the stencil chase but not mounted thereto so that each removable chase does not require a separate seal. A series of successive exposures can readily be made in step and repeat fashion. And yet just one seal suffices for the operation.

Another inventive form of the apparatus effects a vertical exposure arrangement not requiring a rubber blanket. The area encompassed by the suspended peripheral seal is variable in size and/or dimensions to accommodate different stencils with the same seal element. The seal can even extend and seal over the glass.

DESCRIPTION OF THE PREFERRED EMBODIMENTS FIRST EMBODIMENT

Figure 1:
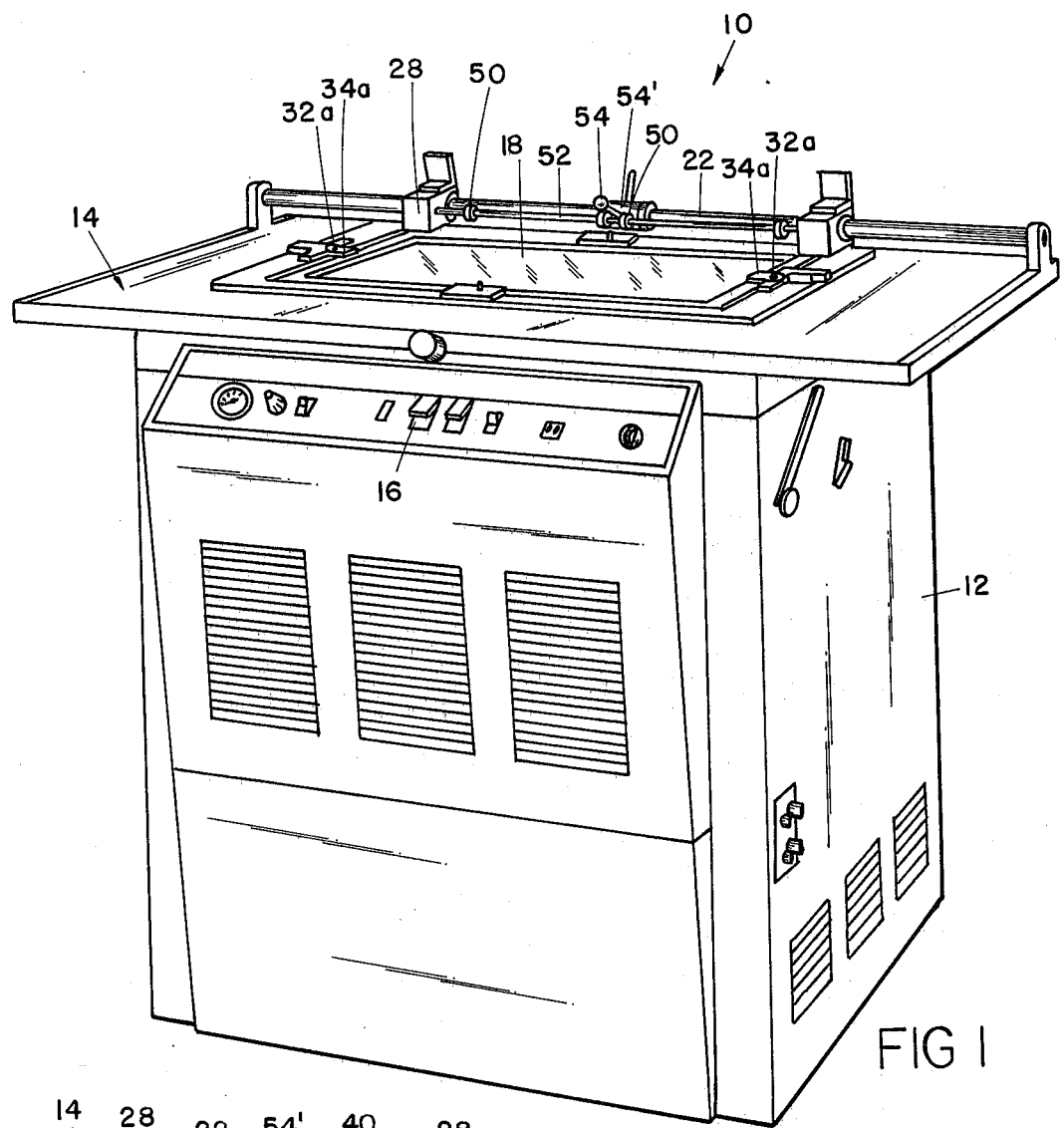
FIG. 1 is a perspective view of the first embodiment which is a stencil exposure table apparatus with a traveling suspension seal.
Figure 2:
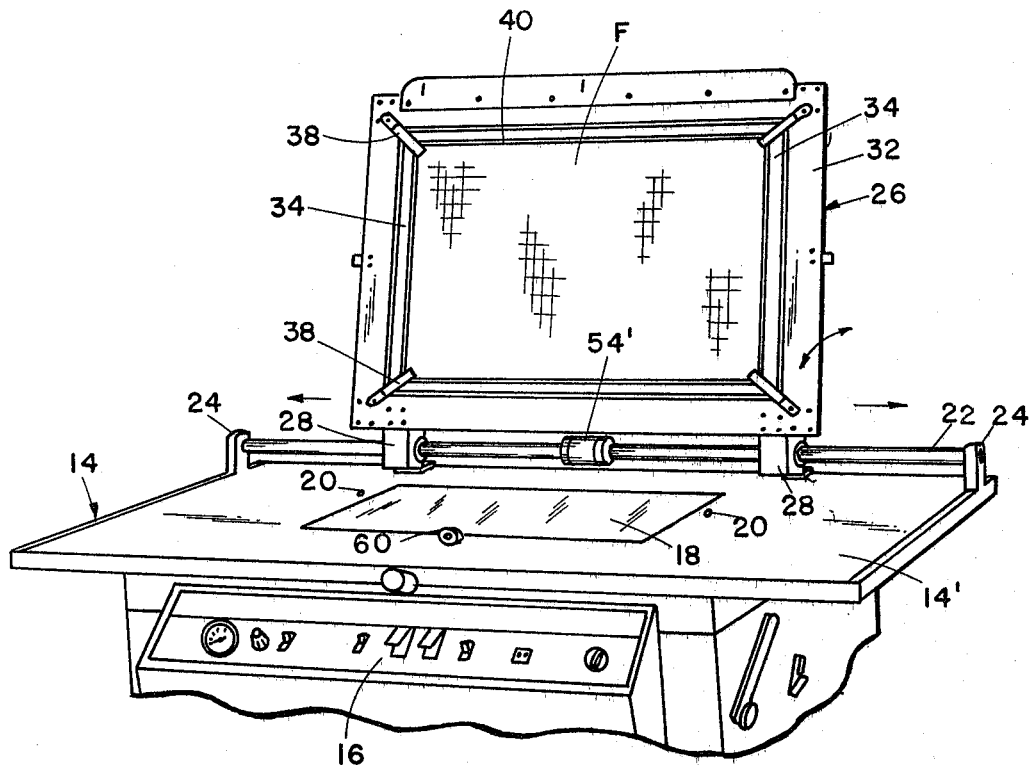
FIG. 2 is a fragmentary perspective view of the apparatus of FIG. 1, with the stencil chase and the carriage frame shown elevated.

Referring now particularly to FIGS. 1–5 of the drawings, the stencil exposure apparatus 10 there shown includes a housing and base 12 supporting an upper, generally horizontal platform subassembly 14 in typical fashion. Mounted on the front of housing 12 are controls 16 for the exposure equipment including an interior light source (not shown) arranged to radiate upwardly through the translucent, usually transparent, support surface 18 mounted in and supported by the surrounding platform 14' (FIG. 2). The upper platform surface 14' is coplanar with the upper surface of glass 18, the glass being recessed into the platform (FIG. 5) and sealed thereto. Element 18 will be referred to herein as the glass, although it will be appreciated that other equivalent materials may sometimes be employed, e.g. "Plexiglas" polymer. At opposite ends of surface 18 are vacuum ports 20 for purposes to be described hereinafter. Vacuum or suction communication with these ports is preferably made alternately using a conventional valve (not shown) as controlled by front panel controls 16.

Extending from end to end across the platform, offset to the rear of glass surface 18 is a fixed guide bar 22 extending between and supported by the end mounts 24 on the platform. Mounted to and supported by guide bar 22 is a carriage subassembly 26, through a pair of bearing blocks 28 which are pivotal about bar 22 and also are slidable along bar 22. Thus, the carriage can be pivoted from a lower generally horizontal position engaging platform 14' to an elevated generally vertical position away from the platform as depicted in FIG. 2, or any position therebetween. The carriage subassembly can also be moved along the guide bar in either direction so that, when lowered, differing portions of the subassembly will coincide with the fixed glass surface 18 in a manner and for reasons to be described hereinafter.

Carriage subassembly 26 includes an outer peripheral carriage frame 32 secured to bearing blocks 28 and defining an internal opening into which is removably fitted a chase 34 that supports the stencil screen F, usually of fabric. This stencil screen is coated with a conventional emulsion coating that is impervious to air and photoresponsive.

Suspended from carriage frame 32 by a plurality of radiating tension elements or straps 38 is a peripheral seal element 40. Straps 38 constitute flexible tension members each of which has the outer end removably attached to carriage frame 32 as by an orificed collar on one end of the strap which slidably fits over a male fastener such as a pin 39 projecting from the carriage frame. The inner end of each strap has a sleeve or collar (FIG. 5) through the seal element 40 extends to form a sliding fit therewith. These straps thus extend generally radially outwardly from the seal element.

Figure 5:
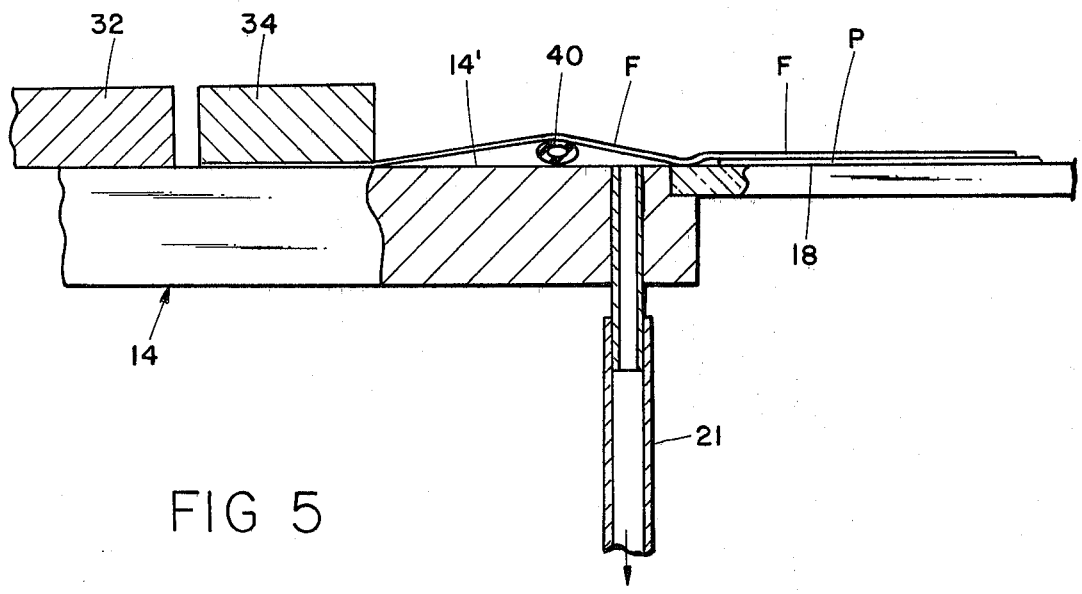
FIG. 5 is a fragmentary, enlarged, sectional, elevational view of a portion of the apparatus in FIG. 1.

Peripheral seal 40 comprises a resilient, endless, flexible impervious element which is compressible to form a tight seal. It is stretchable and made of a good sealing material such as rubber or the equivalent. This seal element is preferably a rubber tube which can be formed into the desired configuration by selective placement of straps 38, as at the corners of the frame. The suspension straps allow the seal to be positioned radially inwardly of the periphery of stencil chase 34 so as to engage and cooperate with stencil screen F to seal it to the glass and/or platform when carriage subassembly 26 is lowered into engagement with the platform as depicted in FIG. 5. Yet the seal element is not mounted on the chase. Suction or vacuum drawn between the undersurface of screen F and above platform surface 14' and glass surface 18, as peripherally sealed by suspension seal 40 will cause the stencil F to be tightly drawn down into close engagement with the stencil pattern positive P (FIG. 5) supported directly on surface 18. This vacuum is drawn through one of passages 20 extending down through the platform and communicating with a vacuum pump (not shown) or other source of vacuum through conduit 21.

Figure 3:
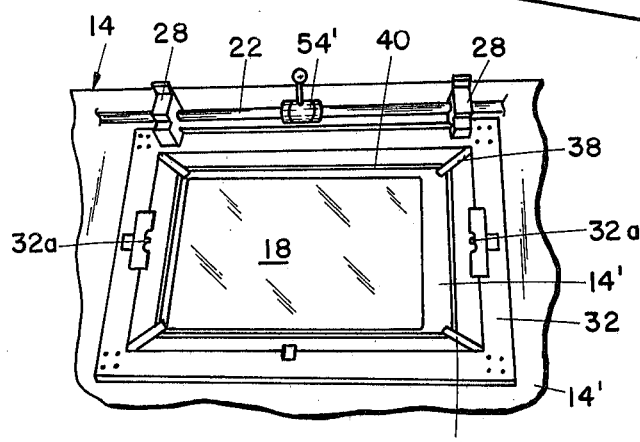
FIG. 3 is a fragmentary perspective view of the central portion of the apparatus in FIG. 1, viewed from above, with the stencil chase removed from the carriage frame to allow viewing of underlying structure.
Figure 4:
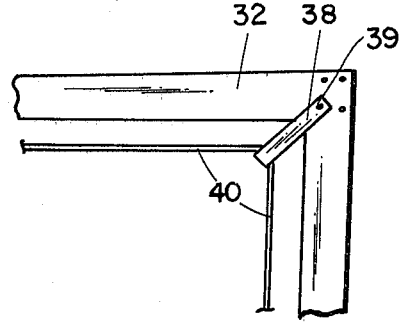
FIG. 4 is a fragmentary view of the underside of a portion of the apparatus in FIG. 3.

The emulsion coated stencil F is retained on chase 34 by any suitable means, as shown for example in U.S. Pat. Nos. 3,273,497 or 3,779,160. This chase is aligned with and removably retained within the confines of carriage frame 32 by the use of a pair of collars 34a on opposite ends of frame 34 which receive and interengage with a pair of upstanding pins 32a on frame 32. In FIG. 3, the center portion of the apparatus in FIG. 1 is depicted, viewed from above, except that frame 34 and any stencil fabric thereon has been removed to show the underlying glass support surface 18, the peripheral seal 40 and portions of suspension straps 38 beneath the level of carriage frame 32.

To facilitate use of the apparatus 10 for step and repeat work, as for repeated exposure of successive portions of the stencil screen F to a relatively small pattern positive P, a plurality of stop collars 50 are mounted in conventional fashion at selected intervals along a support bar 52 having its ends secured to bearing blocks 28 (FIG. 1). These stop collars 50 are thus capable of moving with the carriage assembly to allow them to individually cooperate with a pivotal stop handle 54 secured to a pivotal collar 54' around fixed bar 22. Thus, by arcuately pivoting stop handle 54, it can be caused to engage with or disengage from the movable collars 50 to successively engage these as the carriage is moved in step and repeat fashion as explained in more detail hereinafter.

This apparatus can be used in several different ways, although its primary function is for stencil exposure, including on a step and repeat basis. It can however also be used as light table for opaquing, and as a lineup table, as examples. In the primary use of the machine as an exposure unit, the peripheral seal effectively seals off the area between the impervious coated stencil screen fabric F and the underlying support surface so that vacuum can be applied to cause the fabric to be drawn down into tight engagement with the positive P, thereby enabling selected portions of the fabric to be exposed to light from a source beneath glass 18, radiating up through the glass and through the pattern openings in stencil positive P to expose selected portions of the photoresponsive emulsion coated on the mesh fabric F. To do this, the emulsion coated fabric F mounted on chase 34 is fastened in position within the confines of the carriage frame 32 by interengaging collars 34a on pins 32a. Peripheral seal 40, which is strung through the collars of straps 38, is mounted in place by attachment of the outer ends of the straps to the pin fasteners 39 on frame 32, thereby suspending the seal 40 such that it is overlapping with screen F. Thus, the one seal element effectively seals between the fabric and the underlying platform surface. The stencil pattern P is laced on transparent surface 18. If the pattern covers the glass surface area, the fabric F is lowered by pivoting carriage assembly 26 downwardly into tight engagement such that the fabric is basically centered on the platform. The peripheral seal thus engages both the coated fabric and the platform to peripherally close off the space, allowing vacuum to be drawn through one or both of the orifices 20 to pull the fabric down into tight engagement with the positive P while sealed off tightly at 40. Light then is radiated upwardly through the glass 18 to expose the patterned portions of the fabric F. The operation can be repeated for different colors if desired. After this, the fabric and its chase 34 are removed from the carriage, the fabric is photographically developed in conventional fashion to produce openings in the stencil pattern for subsequent stencilling operations as with a squeegee.

If the pattern P is relatively small and it is desired to produce a multiple of this pattern on the stencil fabric F, the area of the glass around the pattern is covered with opaque material, the carriage is slid toward one end of the platform, vacuum is applied using the closest port 20, one portion of the emulsion coated screen is exposed in the manner already explained, the vacuum is released, the carriage is lifted, shifted laterally until stop lever 54 abuts a stop collar 50, the carriage is lowered again to place a different section of the fabric into engagement with the pattern, vacuum is redrawn, and this process is repeated the desired number of times, using the series of stop collars 50 and stop handle 54 to accurately reposition the carriage each time. The process can be repeated for different colors, using a different pattern each time. As the carriage is shifted and lowered, the seal element will at times extend directly across the glass as well as the other platform areas. Yet it will effectively seal in each instance, enabling the apparatus to be highly versatile. The seal element will always be appropriately positioned relative to the stencil screen, no matter what the shifted position of the carriage, even though not mounted to the stencil chase. Thus, one chase and stencil screen can be removed and replaced with another without affecting the seal arrangement which stays with the carriage frame. For ease of elevating the carriage after the vacuum is released, and to prevent rubbing of the layers during the step and repeat operation, an elevatable roller 60 (FIG. 2) is employed adjacent the front edge of the apparatus to push upwardly on the front outer edge of the carriage. This separates the stencil screen from the positive and the platform for lateral shifting.

If desired, additional supplemental features can be added to the apparatus, such as a horizontal center line marking, a vertical dead line marking, a scale along the platform, and other alignment and guide elements or markings.

SECOND EMBODIMENT

Figure 8:
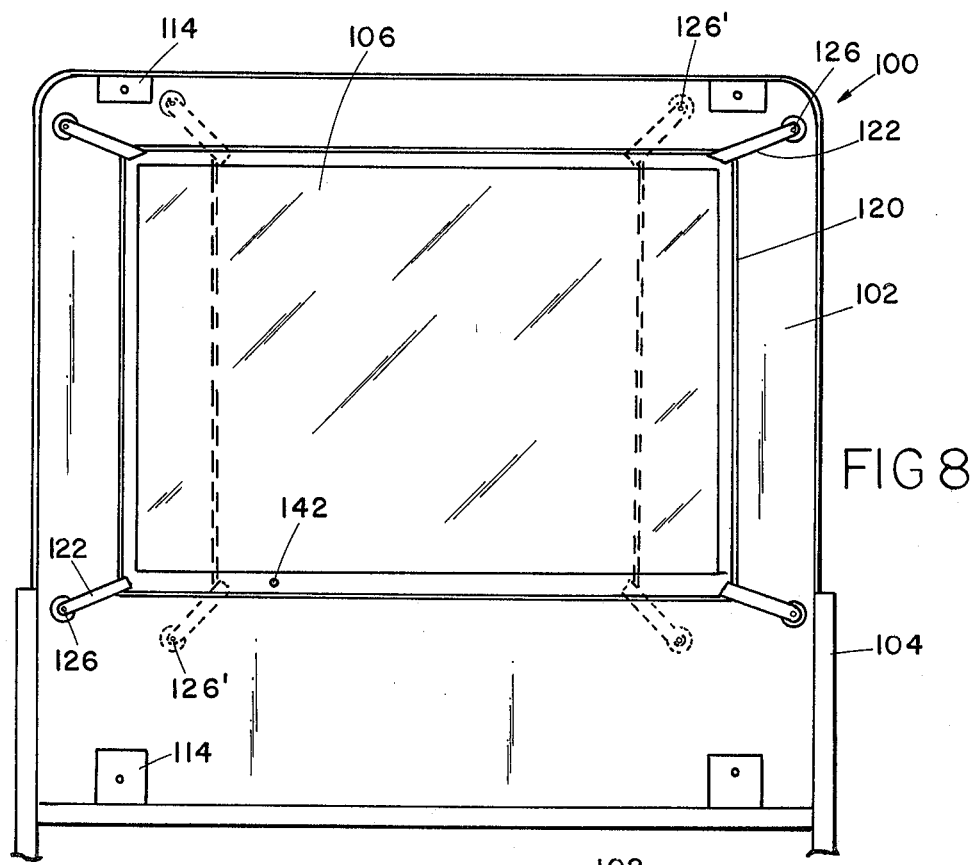
FIG. 8 is an elevational view of the apparatus in FIG. 6, with the stencil screen and chase removed to show the suspended peripheral seal.
Figure 7:
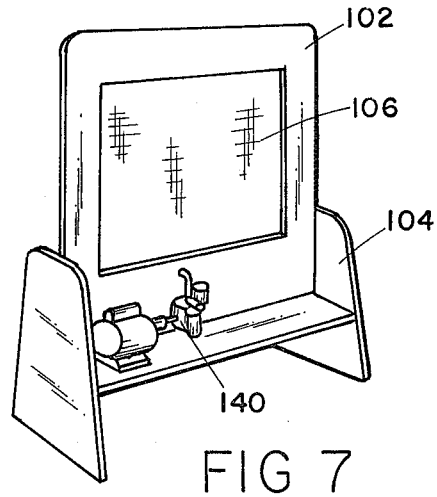
FIG. 7 is a perspective view of the opposite side of the apparatus in FIG. 6.
Figure 6:
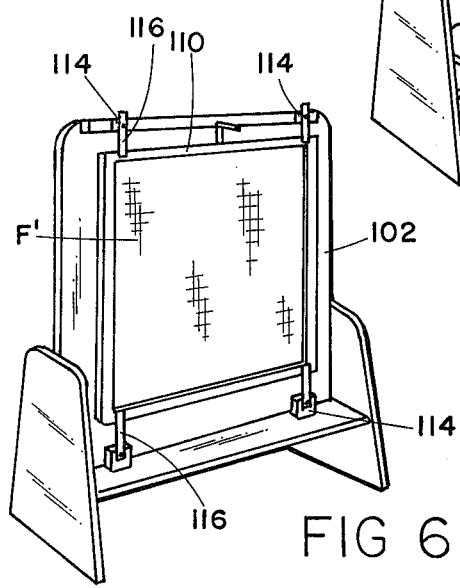
FIG. 6 is a perspective view of the second embodiment which is a vertical stencil exposure unit, shown with a stencil screen in position for exposure.

Referring now specifically to FIGS. 6-8, the stencil exposure apparatus 100 there depicted has a vertical support structure including a frame 102 mounted on end supports 104, this frame forming a peripheral support or mount for a central translucent, preferably transparent, member 106 as of glass. On one side of the glass, to enable a fabric support frame 110 to be removably attached adjacent the glass surface, a plurality of mounting brackets 114 having alignment pins are positioned on frame 102. These brackets 114 cooperate with brackets 116 on stencil chase 110 so that the emulsion coated stencil fabric F' on the chase can be positioned closely adjacent the glass. Suspended between the chase and the peripheral mount 102 is a flexible, compressible, stretchable, peripheral seal element 120 (FIG. 8), preferably a tube of rubber or the equivalent. Seal 120 is held in a desired position by a plurality of outwardly radiating tension straps 122. Seal element 120 extends through a slide collar on one end of each of tension straps 122, the opposite end of each strap having an orifice which receives a fixed pin 126 extending from mount 102. Each of these straps can be attached selectively to alternate pins 126' located at different positions, preferably adjacent the corners of glass 106. This enables the seal 120 to be formed into different dimensional relationships to vary the size and shape of the area encompassed thereby, see e.g. the alternate positions illustrated in solid and phantom lines in FIG. 8. More specifically, this alteration can be made merely by grasping each strap 122, sliding the outer end thereof off one pin 126 and onto an alternate pin 126', causing stretching or contraction of the stretchable resilient seal element to accommodate the new location. Thus, varying sizes and dimensions of stencil screen fabric F' can be accommodated simply by adjusting the dimensions of the seal element to be somewhat smaller than the screen surface and thereby insure engagement therewith. This acts to enclose the space encompassed by the glass surface 106 on one side, the impervious coated stencil fabric F' on the other side, and the peripheral seal element around the edge thereof.

In use of the apparatus, a stencil pattern positive is attached to the surface of glass 106 as by pieces of tape or the like, the peripheral seal is configured with a size and shape to match the stencil screen, the stencil chase 110 with its screen is mounted to supports 114 such that the emulsion coated stencil fabric F' is in peripheral engagement with seal 120 covering the pattern against transparent surface 106, and a vacuum is drawn by vacuum pump 140 (FIG. 7) through an orifice 142 communicating with the space enclosed by glass 106, fabric F', and peripheral seal 120, to draw the stencil fabric into tight engagement with the pattern against transparent surface 106. Then, light from a source (not shown) is radiated through the glass 106 from the back side (FIG. 7) to expose selected portions of the coated, photoresponsive stencil fabric through the pattern areas of the positive. Subsequently, the vacuum is released and the stencil fabric is developed in conventional fashion to form a stencil screen as for printing or the like.

It is conceivable that the hardware details of the apparatus disclosed can be modified in various obvious ways to suit particular type of equipment or a particular type of operation, while still employing the concept presented. Hence, the apparatus disclosed herein is considered as exemplary, with the invention being limited only by the scope of the appended claims and the reasonable equivalent structures to those defined therein.

The embodiments of the invention in which an exclusive property or privilege is claimed are defined as follows.

1. Stencil exposure apparatus comprising:
    a platform having a translucent surface for supporting a stencil pattern thereon;
    a stencil screen chase;
    a carriage on said platform and including means for receiving and retaining said chase adjacent said translucent surface and any stencil pattern thereon;
    a resilient, compressible, peripheral seal element suspended between said platform and said chase to peripherally enclose the space between a stencil pattern on said translucent surface and a stencil screen on said stencil screen chase; and
    suction passage means to said space for applying suction to said space, whereby the stencil pattern and a stencil screen can be pulled together by suction for accurate exposure by light through said translucent surface;
    said peripheral seal element comprising an endless impervious element suspended by a plurality of tension elements attached to said carriage.

2. The stencil exposure apparatus in claim 1 wherein said tension elements radiate outwardly from said peripheral seal element.

3. The stencil exposure apparatus in claim 2 wherein said carriage with said stencil chase is shiftable toward and away from said translucent surface.

4. The stencil exposure apparatus in claim 2 including carriage mounting and guiding means for mounting said carriage and enabling said carriage to be moved controlled amounts along said translucent surface.

5. The stencil exposure apparatus in claim 1 wherein said carriage is also shiftable on said mounting and guiding means toward and away from said translucent surface.

6. Stencil exposure apparatus comprising: a translucent surface for supporting a stencil pattern thereon, and peripheral mounting means for said translucent surface;
    a stencil screen chase for supporting a stencil screen, and attachment means between said mounting means and said chase for positioning the stencil screen adjacent a stencil pattern on said translucent surface; and
    a peripheral seal element suspended between said mounting means and said chase, generally about said translucent surface;
    said seal element being suspended by tension elements attached to said mounting means.

7. The stencil exposure apparatus in claim 6 wherein said peripheral seal element is resiliently stretchable, and said mounting means has a plurality of spaced attachment means to which each tension element can be removably attached, whereby the area defined by said peripheral seal element can be varied to accommodate different size stencil patterns.

8. Stencil exposure apparatus comprising:
- a translucent surface for supporting a stencil pattern thereon, and peripheral mounting means for said translucent surface;
- a stencil screen chase for supporting a stencil screen, and attachment means between said mounting means and said chase for positioning the stencil screen adjacent a stencil pattern on said translucent surface; and
- a peripheral seal element suspended between said mounting means and said chase, generally about said translucent surface;
- said mounting means including a fixed peripheral support for said translucent surface and also a carriage movable with respect to said translucent surface; and tension elements suspending said seal element, said tension elements being attached to said carriage to be moved therewith, and being in a manner radiating generally outwardly relative to said translucent surface.

* * * * *

UNITED STATES PATENT AND TRADEMARK OFFICE
CERTIFICATE OF CORRECTION

PATENT NO. : 4,083,301
DATED : April 11, 1978
INVENTOR(S) : James A. Black

It is certified that error appears in the above-identified patent and that said Letters Patent are hereby corrected as shown below:

Column 3, line 18:

After "through" delete "the" and insert ---which---

Column 3, line 66:

After "fixed" insert ---guide---

Column 4, line 7:

After "as" (first occurrence) insert ---a---

Signed and Sealed this

Seventeenth Day of October 1978

[SEAL]

Attest:

RUTH C. MASON
*Attesting Officer*

DONALD W. BANNER
*Commissioner of Patents and Trademarks*